US011203181B2

(12) United States Patent
Bai et al.

(10) Patent No.: US 11,203,181 B2
(45) Date of Patent: Dec. 21, 2021

(54) BARRIER FILM-CONTAINING FORMAT AND THE USE THEREOF FOR PRE-APPLIED UNDERFILL FILM FOR 3D TSV PACKAGES

(71) Applicants: Henkel IP & Holding GmbH, Duesseldorf (DE); Henkel AG & Co. KGaA, Duesseldorf (DE)

(72) Inventors: Jie Bai, Aliso Viejo, CA (US); Yusuke Horiguchi, Kanagawa (JP); Hung Chau, Fountain Valley, CA (US); Tadashi Takano, Kanagawa (JP)

(73) Assignees: Henkel AG & Co. KGaA, Duesseldorf (DE); Henkel IP & Holding GmbH, Duesseldorf (DE)

( * ) Notice: Subject to any disclaimer, the term of this patent is extended or adjusted under 35 U.S.C. 154(b) by 244 days.

(21) Appl. No.: 15/873,087

(22) Filed: Jan. 17, 2018

(65) Prior Publication Data

US 2018/0126698 A1   May 10, 2018

Related U.S. Application Data

(63) Continuation of application No. PCT/US2016/043042, filed on Jul. 20, 2016.

(60) Provisional application No. 62/198,435, filed on Jul. 29, 2015.

(51) Int. Cl.
| | |
|---|---|
| *B32B 7/12* | (2006.01) |
| *B32B 7/06* | (2019.01) |
| *B32B 27/08* | (2006.01) |
| *B32B 27/20* | (2006.01) |
| *B32B 27/36* | (2006.01) |
| *H01L 51/00* | (2006.01) |
| *B32B 27/42* | (2006.01) |
| *B32B 27/38* | (2006.01) |
| *B32B 27/28* | (2006.01) |
| *B32B 27/32* | (2006.01) |
| *B32B 27/30* | (2006.01) |
| *B32B 27/18* | (2006.01) |
| *C09J 7/38* | (2018.01) |
| *C09J 7/50* | (2018.01) |
| *C09J 7/40* | (2018.01) |

(52) U.S. Cl.
CPC ............... *B32B 7/06* (2013.01); *B32B 7/12* (2013.01); *B32B 27/08* (2013.01); *B32B 27/18* (2013.01); *B32B 27/20* (2013.01); *B32B 27/281* (2013.01); *B32B 27/283* (2013.01); *B32B 27/304* (2013.01); *B32B 27/308* (2013.01); *B32B 27/322* (2013.01); *B32B 27/36* (2013.01); *B32B 27/38* (2013.01); *B32B 27/42* (2013.01); *C09J 7/385* (2018.01); *C09J 7/401* (2018.01); *C09J 7/50* (2018.01); *H01L 51/003* (2013.01); *H01L 51/0097* (2013.01); *B32B 2255/10* (2013.01); *B32B 2255/26* (2013.01); *B32B 2274/00* (2013.01); *B32B 2307/714* (2013.01); *B32B 2307/748* (2013.01); *B32B 2457/00* (2013.01); *B32B 2457/14* (2013.01); *C09J 2433/00* (2013.01); *C09J 2433/003* (2013.01); *C09J 2467/005* (2013.01); *Y02E 10/549* (2013.01)

(58) Field of Classification Search
None
See application file for complete search history.

(56) References Cited

U.S. PATENT DOCUMENTS

| | | | |
|---|---|---|---|
| 5,717,034 A | 2/1998 | Dershem et al. | |
| 5,718,941 A | 2/1998 | Dershem et al. | |
| 9,840,645 B2 | 12/2017 | Koyama | |
| 2001/0001047 A1* | 5/2001 | Nelson | C09J 7/22 |
| | | | 428/349 |
| 2010/0136275 A1 | 6/2010 | Amano | |
| 2010/0279491 A1 | 11/2010 | Kiuchi et al. | |
| 2012/0121878 A1* | 5/2012 | Bilcai | C08L 63/00 |
| | | | 428/220 |
| 2013/0009365 A1* | 1/2013 | Kabutoya | F16J 15/022 |
| | | | 277/312 |
| 2013/0196472 A1* | 8/2013 | Hoang | H01L 21/02002 |
| | | | 438/118 |
| 2013/0210239 A1* | 8/2013 | Kim | H01L 21/563 |
| | | | 438/759 |

(Continued)

FOREIGN PATENT DOCUMENTS

| | | |
|---|---|---|
| JP | 2012244115 | 12/2012 |
| WO | 1986007013 | 12/1986 |
| WO | 2010139802 | 12/2010 |

(Continued)

OTHER PUBLICATIONS

"Semiconductor Chip Underfill Materials", Encyclopedia of Materials: Science and Technology, Elsevier Science Ltd. (Year: 2001).*

(Continued)

*Primary Examiner* — Anish P Desai
(74) *Attorney, Agent, or Firm* — Steven C. Bauman

(57) ABSTRACT

Provided herein are stabilized underfill film-containing assemblies which extend the work-life of underfill films. In accordance with certain aspects of the present invention, there are also provided stabilized underfill film-containing assemblies which extend the shelf-life of underfill films. In certain aspects of the present invention, there are also provided methods for extending the work-life of underfill films. In another aspect of the present invention, there are also provided methods for extending the shelf-life of underfill films.

9 Claims, 2 Drawing Sheets

(56) References Cited

U.S. PATENT DOCUMENTS

2015/0064851 A1    3/2015  Gallagher et al.
2016/0056123 A1*   2/2016  Morita .................. B32B 27/281
                                                            438/118

FOREIGN PATENT DOCUMENTS

| WO | 2013114955 | 8/2013 |
| WO | 2014156883 | 10/2014 |
| WO | 2015037634 | 3/2015 |

OTHER PUBLICATIONS

International Search Report issued in connection with International Patent Application No. PCT/US2016/043042 dated Oct. 13, 2016.

* cited by examiner

BARRIER FILM-CONTAINING FORMAT AND THE USE THEREOF FOR PRE-APPLIED UNDERFILL FILM FOR 3D TSV PACKAGES

FIELD OF THE INVENTION

The present invention relates to stabilized underfill film-containing assemblies which extend the work-life of underfill films. The present invention also relates to stabilized underfill film-containing assemblies which extend the shelf-life of underfill films. In another aspect, the invention relates to methods for extending the work-life of underfill films. In still another aspect, the present invention also relates to methods for extending the shelf-life of underfill films.

SUMMARY OF THE INVENTION

In accordance with the present invention, there are provided stabilized underfill film-containing assemblies which extend the work-life of underfill films. In accordance with certain aspects of the present invention, there are also provided stabilized underfill film-containing assemblies which extend the shelf-life of underfill films.

In certain aspects of the present invention, there are also provided methods for extending the work-life of underfill films. In additional aspects of the present invention, there are also provided methods for extending the shelf-life of underfill films.

DETAILED DESCRIPTION OF THE INVENTION

Figure 1:
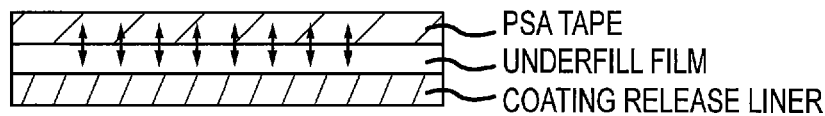
FIG. 1 illustrates a prior art format for underfill film assemblies, comprising an underfill film layer between a coating release liner and a pressure sensitive adhesive (PSA) tape.

In accordance with the present invention, there are provided underfill film-containing assembly(ies), said assembly(ies) comprising:
an underfill film layer between
a coating release liner, and
a barrier film.

A wide variety of underfill films are contemplated for use in accordance with the present invention. In some embodiments, underfill films comprise a thermoset resin. Exemplary thermoset resins include epoxy-based resins, maleimide-based resins, nadimide-based resins, itaconamide-based resins, acrylate-based resins, cyanate ester-based resins, silicones, oxetanes, polyester-based resins, polyurethane-based resins, polyimide-based resins, melamine-based resins, urea-formaldehyde-based resins, phenol-formaldehyde-based resins, and the like, as well as mixtures of any two or more thereof.

Epoxies

A wide variety of epoxy-functionalized resins are contemplated for use herein, e.g., liquid-type epoxy resins based on bisphenol A, solid-type epoxy resins based on bisphenol A, liquid-type epoxy resins based on bisphenol F (e.g., Epiclon EXA-835LV), multifunctional epoxy resins based on phenol-novolac resin, dicyclopentadiene-type epoxy resins (e.g., Epiclon HP-7200L), naphthalene-type epoxy resins, and the like, as well as mixtures of any two or more thereof.

Exemplary epoxy-functionalized resins contemplated for use herein include the diepoxide of the cycloaliphatic alcohol, hydrogenated bisphenol A (commercially available as Epalloy 5000), a difunctional cycloaliphatic glycidyl ester of hexahydrophthallic anhydride (commercially available as Epalloy 5200), Epiclon EXA-835LV, Epiclon HP-7200L, and the like, as well as mixtures of any two or more thereof.

In certain embodiments, the epoxy component may include the combination of two or more different bisphenol based epoxies. These bisphenol based epoxies may be selected from bisphenol A, bisphenol F, or bisphenol S epoxies, or combinations thereof. In addition, two or more different bisphenol epoxies within the same type of resin (such as A, F or S) may be used.

Commercially available examples of the bisphenol epoxies contemplated for use herein include bisphenol-F-type epoxies (such as RE-404-S from Nippon Kayaku, Japan, and EPICLON 830 (RE1801), 830S (RE1815), 830A (RE1826) and 830W from Dai Nippon Ink & Chemicals, Inc., and RSL 1738 and YL-983U from Resolution) and bisphenol-A-type epoxies (such as YL-979 and 980 from Resolution).

The bisphenol epoxies available commercially from Dai Nippon and noted above are promoted as liquid undiluted epichlorohydrin-bisphenol F epoxies having much lower viscosities than conventional epoxies based on bisphenol A epoxies and have physical properties similar to liquid bisphenol A epoxies. Bisphenol F epoxy has lower viscosity than bisphenol A epoxies, all else being the same between the two types of epoxies, which affords a lower viscosity and thus a fast flow underfill sealant material. The EEW of these four bisphenol F epoxies is between 165 and 180. The viscosity at 25° C. is between 3,000 and 4,500 cps (except for RE1801 whose upper viscosity limit is 4,000 cps). The hydrolyzable chloride content is reported as 200 ppm for RE1815 and 830W, and that for RE1826 as 100 ppm.

The bisphenol epoxies available commercially from Resolution and noted above are promoted as low chloride containing liquid epoxies. The bisphenol A epoxies have a EEW (g/eq) of between 180 and 195 and a viscosity at 25° C. of between 100 and 250 cps. The total chloride content for YL-979 is reported as between 500 and 700 ppm, and that for YL-980 as between 100 and 300 ppm. The bisphenol F epoxies have a EEW (g/eq) of between 165 and 180 and a viscosity at 25° C. of between 30 and 60. The total chloride content for RSL-1738 is reported as between 500 and 700 ppm, and that for YL-983U as between 150 and 350 ppm.

In addition to the bisphenol epoxies, other epoxy compounds are contemplated for use as the epoxy component of invention formulations. For instance, cycloaliphatic epoxies, such as 3,4-epoxycyclohexylmethyl-3,4-epoxycyclohexylcarbonate, can be used. Also monofunctional, difunctional or multifunctional reactive diluents may be used to adjust the viscosity and/or lower the Tg of the resulting resin material. Exemplary reactive diluents include butyl glycidyl ether, cresyl glycidyl ether, polyethylene glycol glycidyl ether, polypropylene glycol glycidyl ether, and the like.

Epoxies suitable for use herein include polyglycidyl derivatives of phenolic compounds, such as those available commercially under the tradename EPON, such as EPON 828, EPON 1001, EPON 1009, and EPON 1031 from Resolution; DER 331, DER 332, DER 334, and DER 542 from Dow Chemical Co.; and BREN-S from Nippon Kayaku. Other suitable epoxies include polyepoxides prepared from polyols and the like and polyglycidyl derivatives of phenol-formaldehyde novolacs, the latter of such as DEN 431, DEN 438, and DEN 439 from Dow Chemical. Cresol analogs are also available commercially under the tradename ARALDITE, such as ARALDITE ECN 1235, ARALDITE ECN 1273, and ARALDITE ECN 1299 from Ciba Specialty Chemicals Corporation. SU-8 is a bisphenol-A-type epoxy novolac available from Resolution. Polyglycidyl adducts of amines, aminoalcohols and polycarboxylic acids are also useful in this invention, commercially available resins of which include GLYAMINE 135, GLYAMINE 125, and GLYAMINE 115 from F.I.C. Corporation; ARALDITE MY-720, ARALDITE 0500, and ARALDITE 0510 from Ciba Specialty Chemicals and PGA-X and PGA-C from the Sherwin-Williams Co.

Appropriate monofunctional epoxy coreactant diluents for optional use herein include those that have a viscosity which is lower than that of the epoxy component, ordinarily, less than about 250 cps.

The monofunctional epoxy coreactant diluents should have an epoxy group with an alkyl group of about 6 to about 28 carbon atoms, examples of which include $C_{6-28}$ alkyl glycidyl ethers, $C_{6-28}$ fatty acid glycidyl esters, $C_{6-28}$ alkylphenol glycidyl ethers, and the like.

In the event such a monofunctional epoxy coreactant diluent is included, such coreactant diluent should be employed in an amount from about 0.5 percent by weight to about 10 percent by weight, based on the total weight of the composition; in some embodiments, such coreactant diluent should be employed in an amount from about 0.25 percent by weight to about 5 percent by weight, based on the total weight of the composition.

The epoxy component should be present in the composition in an amount in the range of about 1 percent by weight to about 20 percent by weight; in some embodiments, invention formulations comprise about 2 percent by weight to about 18 percent by weight epoxy; in some embodiments, invention formulations comprise about 5 to about 15 percent by weight epoxy.

In some embodiments, the epoxy component employed herein is a silane modified epoxy, e.g., a composition of matter that includes:

(A) an epoxy component embraced by the following structure:

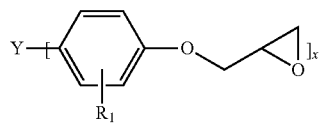

where:

Y may or may not be present and when Y present is a direct bond, $CH_2$, $CH(CH_3)_2$, $C=O$, or S, $R_1$ here is alkyl, alkenyl, hydroxy, carboxy and halogen, and x here is 1-4;

(B) an epoxy-functionalized alkoxy silane embraced by the following structure:

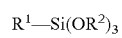

wherein $R^1$ is an oxirane-containing moiety and $R^2$ is an alkyl or alkoxy-substituted alkyl, aryl, or aralkyl group having from one to ten carbon atoms; and (C) reaction products of components (A) and (B).

An example of one such silane-modified epoxy is formed as the reaction product of an aromatic epoxy, such as a bisphenol A, E, F or S epoxy or biphenyl epoxy, and epoxy silane where the epoxy silane is embraced by the following structure:

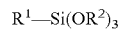

wherein $R_1$ is an oxirane-containing moiety, examples of which include 2-(ethoxymethyl)oxirane, 2-(propoxymethyl)oxirane, 2-(methoxymethyl)oxirane, and 2-(3-methoxypropyl)oxirane and $R^2$ is an alkyl or alkoxy-substituted alkyl, aryl, or aralkyl group having from one to ten carbon atoms.

In one embodiment, $R_1$ is 2-(ethoxymethyl)oxirane and $R^2$ is methyl.

Idealized structures of the aromatic epoxy used to prepare the silane modified epoxy include

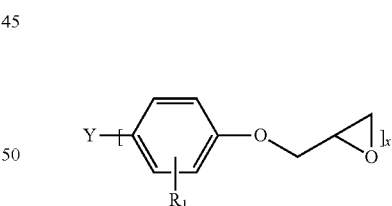

wherein

Y may or may not be present, and when Y is present, it is a direct bond, $CH_2$, $CH(CH_3)_2$, $C=O$, or S, $R_1$ is alkyl, alkenyl, hydroxy, carboxy or halogen, and x is 1-4.

Of course, when x is 2-4, chain extended versions of the aromatic epoxy are also contemplated as being embraced by this structure.

For instance, a chain extended version of the aromatic epoxy may be embraced by the structure below

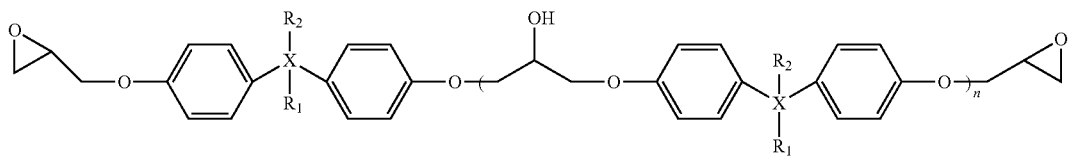

In some embodiments, the siloxane modified epoxy resin has the structure:

—(O—Si(Me)$_2$-O—Si(Me)(Z)—O—Si(Me)$_2$-O—Si(Me)$_2$)$_n$— wherein:

Z is —O—(CH$_2$)$_3$—O-Ph-CH$_2$-Ph-O—(CH$_2$—CH(OH)—CH$_2$—O-Ph-CH$_2$-Ph-O—)$_n$—CH$_2$-oxirane, and n falls in the range of about 1-4.

In some embodiments, the siloxane modified epoxy resin is produced by contacting a combination of the following components under conditions suitable to promote the reaction thereof:

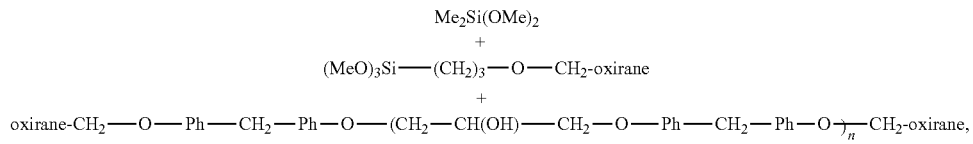

wherein "n" falls in the range of about 1-4.

The silane modified epoxy may also be a combination of the aromatic epoxy, the epoxy silane, and reaction products of the aromatic epoxy and the epoxy silane. The reaction products may be prepared from the aromatic epoxy and epoxy silane in a weight ratio of 1:100 to 100:1, such as a weight ratio of 1:10 to 10:1.

Quantities of epoxy monomer(s) contemplated for use in invention compositions are sufficient so that the resulting formulation comprises in the range of about 1-20 wt % of said epoxy. In certain embodiments, the resulting formulation comprises in the range of about 2-18 wt % of said epoxy. In certain embodiments, the resulting formulation comprises in the range of about 5-15 wt % of said epoxy.

Epoxy cure agents are optionally employed in combination with epoxy monomer(s). Exemplary epoxy cure agents include ureas, aliphatic and aromatic amines, amine hardeners, polyamides, imidazoles, dicyandiamides, hydrazides, urea-amine hybrid curing systems, free radical initiators (e.g., peroxy esters, peroxy carbonates, hydroperoxides, alkylperoxides, arylperoxides, azo compounds, and the like), organic bases, transition metal catalysts, phenols, acid anhydrides, Lewis acids, Lewis bases, and the like.

When epoxy cure agents are present, invention compositions comprise in the range of about 0.1-2 wt % thereof. In certain embodiments, invention compositions comprise in the range of about 0.5-5 wt % of epoxy cure agent.

Maleimides, Nadimides or Itaconimides

Maleimides, nadimides or itaconimides contemplated for use herein are compounds having the structure:

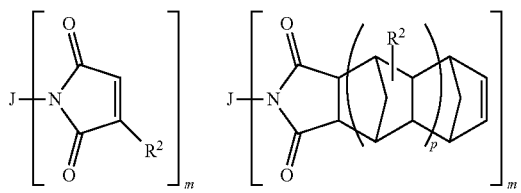

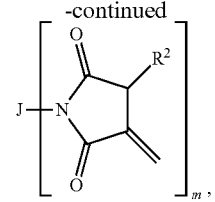

respectively, wherein:

m is 1-15, p is 0-15, each R$^2$ is independently selected from hydrogen or lower alkyl (such as C$_{1-5}$), and J is a monovalent or a polyvalent radical comprising organic or organosiloxane radicals, and combinations of two or more thereof.

In some embodiments of the present invention, J is a monovalent or polyvalent radical selected from:

hydrocarbyl or substituted hydrocarbyl species typically having in the range of about 6 up to about 500 carbon atoms, where the hydrocarbyl species is selected from alkyl, alkenyl, alkynyl, cycloalkyl, cycloalkenyl, aryl, alkylaryl, arylalkyl, aryalkenyl, alkenylaryl, arylalkynyl or alkynylaryl, provided, however, that X can be aryl only when X comprises a combination of two or more different species;

hydrocarbylene or substituted hydrocarbylene species typically having in the range of about 6 up to about 500 carbon atoms, where the hydrocarbylene species are selected from alkylene, alkenylene, alkynylene, cycloalkylene, cycloalkenylene, arylene, alkylarylene, arylalkylene, arylalkenylene, alkenylarylene, arylalkynylene or alkynylarylene, heterocyclic or substituted heterocyclic species typically having in the range of about 6 up to about 500 carbon atoms, polysiloxane, or polysiloxane-polyurethane block copolymers, as well as combinations of one or more of the above with a linker selected from covalent bond, —O—, —S—, —NR—, —NR—C(O)—, —NR—C(O)—O—, —NR—C(O)—NR—, —S—C(O)—, —S—C(O)—O—, —S—C(O)—NR—, —O—S(O)$_2$—, —O—S(O)$_2$—O—, —O—S(O)$_2$—NR—, —O—S(O)—, —O—S(O)—O—, —O—S(O)—NR—, —O—NR—C(O)—, —O—NR—C(O)—O—, —O—NR—C(O)—NR—, —NR—O—C(O)—, —NR—O—C(O)—O—, —NR—O—C(O)—NR—, —O—NR—C(S)—, —O—NR—C(S)—O—, —O—NR—C(S)—NR—, —NR—O—C(S)—, —NR—O—C(S)—O—, —NR—O—C(S)—NR—, —O—C(S)—, —O—C(S)—O—, —O—C(S)—NR—, —NR—C(S)—, —NR—C(S)—O—, —NR—C(S)—NR—, —S—S(O)$_2$—, —S—S(O)$_2$—O—, —S—S(O)$_2$—NR—, —NR—O—S(O)—, —NR—O—S(O)—O—, —NR—O—S(O)—NR—, —NR—O—S(O)$_2$—, —NR—O—S(O)$_2$—O—, —NR—O—S(O)$_2$—NR—, —O—NR—S(O)—, —O—NR—S(O)—O—, —O—NR—S(O)—NR—, —O—NR—S(O)$_2$—O—, —O—NR—S(O)$_2$—NR—, —O—NR—S(O)$_2$—, —O—P(O)R$_2$—, —S—P(O)R$_2$—, or —NR—P(O)R$_2$—; where each R is independently hydrogen, alkyl or substituted alkyl.

Exemplary compositions include those wherein J is oxyalkyl, thioalkyl, aminoalkyl, carboxyalkyl, oxyalkenyl, thioalkenyl, aminoalkenyl, carboxyalkenyl, oxyalkynyl, thioalkynyl, aminoalkynyl, carboxyalkynyl, oxycycloalkyl, thiocycloalkyl, aminocycloalkyl, carboxycycloalkyl, oxycloalkenyl, thiocycloalkenyl, aminocycloalkenyl, carboxycycloalkenyl, heterocyclic, oxyheterocyclic, thioheterocyclic, aminoheterocyclic, carboxyheterocyclic, oxyaryl, thioaryl, aminoaryl, carboxyaryl, heteroaryl, oxyheteroaryl, thioheteroaryl, aminoheteroaryl, carboxyheteroaryl, oxyalkylaryl, thioalkylaryl, aminoalkylaryl, carboxyalkylaryl, oxyarylalkyl, thioarylalkyl, aminoarylalkyl, carboxyarylalkyl, oxyarylalkenyl, thioarylalkenyl, aminoarylalkenyl, carboxyarylalkenyl, oxyalkenylaryl, thioalkenylaryl, aminoalkenylaryl, carboxyalkenylaryl, oxyarylalkynyl, thioarylalkynyl, aminoarylalkynyl, carboxyarylalkynyl, oxyalkynylaryl, thioalkynylaryl, aminoalkynylaryl or carboxyalkynylaryl, oxyalkylene, thioalkylene, aminoalkylene, carboxyalkylene, oxyalkenylene, thioalkenylene, aminoalkenylene, carboxyalkenylene, oxyalkynylene, thioalkynylene, aminoalkynylene, carboxyalkynylene, oxycycloalkylene, thiocycloalkylene, aminocycloalkylene, carboxycycloalkylene, oxycycloalkenylene, thiocycloalkenylene, aminocycloalkenylene, carboxycycloalkenylene, oxyarylene, thioarylene, aminoarylene, carboxyarylene, oxyalkylarylene, thioalkylarylene, aminoalkylarylene, carboxyalkylarylene, oxyarylalkylene, thioarylalkylene, aminoarylalkylene, carboxyarylalkylene, oxyarylalkenylene, thioarylalkenylene, aminoarylalkenylene, carboxyarylalkenylene, oxyalkenylarylene, thioalkenylarylene, aminoalkenylarylene, carboxyalkenylarylene, oxyarylalkynylene, thioarylalkynylene, aminoarylalkynylene, carboxy arylalkynylene, oxyalkynylarylene, thioalkynylarylene, aminoalkynylarylene, carboxyalkynylarylene, heteroarylene, oxyheteroarylene, thioheteroarylene, aminoheteroarylene, carboxyheteroarylene, heteroatom-containing di- or polyvalent cyclic moiety, oxyheteroatom-containing di- or polyvalent cyclic moiety, thioheteroatom-containing di- or polyvalent cyclic moiety, aminoheteroatom-containing di- or polyvalent cyclic moiety, or a carboxyheteroatom-containing di- or polyvalent cyclic moiety.

Acrylates

Acrylates contemplated for use in the practice of the present invention are well known in the art. See, for example, U.S. Pat. No. 5,717,034, the entire contents of which are hereby incorporated by reference herein.

Exemplary acrylates contemplated for use herein include monofunctional (meth)acrylates, difunctional (meth)acrylates, trifunctional (meth)acrylates, polyfunctional (meth)acrylates, and the like.

Exemplary monofunctional (meth)acrylates include phenylphenol acrylate, methoxypolyethylene acrylate, acryloyloxyethyl succinate, fatty acid acrylate, methacryloyloxyethylphthalic acid, phenoxyethylene glycol methacrylate, fatty acid methacrylate, β-carboxyethyl acrylate, isobornyl acrylate, isobutyl acrylate, t-butyl acrylate, hydroxyethyl acrylate, hydroxypropyl acrylate, dihydrocyclopentadiethyl acrylate, cyclohexyl methacrylate, t-butyl methacrylate, dimethylaminoethyl methacrylate, diethylaminoethyl methacrylate, t-butylaminoethyl methacrylate, 4-hydroxybutyl acrylate, tetrahydrofurfuryl acrylate, benzyl acrylate, ethylcarbitol acrylate, phenoxyethyl acrylate, methoxytriethylene glycol acrylate, monopentaerythritol acrylate, dipentaerythritol acrylate, tripentaerythritol acrylate, polypentaerythritol acrylate, and the like.

Exemplary difunctional (meth)acrylates include hexanediol dimethacrylate, hydroxyacryloyloxypropyl methacrylate, hexanediol diacrylate, urethane acrylate, epoxyacrylate, bisphenol A-type epoxyacrylate, modified epoxyacrylate, fatty acid-modified epoxyacrylate, amine-modified bisphenol A-type epoxyacrylate, allyl methacrylate, ethylene glycol dimethacrylate, diethylene glycol dimethacrylate, ethoxylated bisphenol A dimethacrylate, tricyclodecanedimethanol dimethacrylate, glycerin dimethacrylate, polypropylene glycol diacrylate, propoxylated ethoxylated bisphenol A diacrylate, 9,9-bis(4-(2-acryloyloxyethoxy)phenyl)fluorene, tricyclodecane diacrylate, dipropylene glycol diacrylate, polypropylene glycol diacrylate, PO-modified neopentyl glycol diacrylate, tricyclodecanedimethanol diacrylate, 1,12-dodecanediol dimethacrylate, and the like.

Exemplary trifunctional (meth)acrylates include trimethylolpropane trimethacrylate, trimethylolpropane triacrylate, trimethylolpropane ethoxy triacrylate, polyether triacrylate, glycerin propoxy triacrylate, and the like.

Exemplary polyfunctional (meth)acrylates include dipentaerythritol polyacrylate, dipentaerythritol hexaacrylate, pentaerythritol tetraacrylate, pentaerythritolethoxy tetraacrylate, ditrimethylolpropane tetraacrylate, and the like.

Additional exemplary acrylates contemplated for use in the practice of the present invention include those described in U.S. Pat. No. 5,717,034, the entire contents of which are hereby incorporated by reference herein.

Cyanate Ester-Based Resins

Cyanate ester monomers contemplated for use in the practice of the present invention contain two or more ring forming cyanate (—O—C≡N) groups which cyclotrimerize to form substituted triazine rings upon heating. Because no leaving groups or volatile byproducts are formed during curing of the cyanate ester monomer, the curing reaction is referred to as addition polymerization. Suitable polycyanate ester monomers that may be used in the practice of the present invention include, for example, 1,1-bis(4-cyanatophenyl)methane, 1,1-bis(4-cyanatophenyl)ethane, 2,2-bis(4-cyanatophenyl)propane, bis(4-cyanatophenyl)-2,2-butane, 1,3-bis[2-(4-cyanato phenyl)propyl]benzene, bis(4-cyanatophenyl)ether, 4,4'-dicyanatodiphenyl, bis(4-cyanato-3,5-dimethylphenyl)methane, tris(4-cyanatophenyl)ethane, cyanated novolak, 1,3-bis[4-cyanatophenyl-1-(1-methylethylidene)]benzene, cyanated phenoldicyclopentadiene adduct, and the like. Polycyanate ester monomers utilized in accordance with the present invention may be readily prepared by reacting appropriate dihydric or polyhydric phenols with a cyanogen halide in the presence of an acid acceptor.

Monomers that can optionally be combined with polycyanate ester monomer(s) in accordance with the present invention are selected from those monomers which undergo addition polymerization. Such monomers include vinyl ethers, divinyl ethers, diallyl ethers, dimethacrylates, dipropargyl ethers, mixed propargyl allyl ethers, monomaleimides, bismaleimides, and the like. Examples of such monomers include cyclohexanedimethanol monovinyl ether, trisallylcyanurate, 1,1-bis(4-allyloxyphenyl)ethane, 1,1-bis(4-propargyloxyphenyl)ethane, 1,1-bis(4-allyloxyphenyl-4'-propargyloxyphenyl)ethane, 3-(2,2-dimethyltrimethylene acetal)-1-maleimidobenzene, 2,2,4-trimethylhexamethylene-1,6-bismaleimide, 2,2-bis[4-(4-maleimidophenoxy)phenyl]propane, and the like.

Additional cyanate esters contemplated for use in the practice of the present invention are well known in the art. See, for example, U.S. Pat. No. 5,718,941, the entire contents of which are hereby incorporated by reference herein.

Silicones

Silicones contemplated for use in the practice of the present invention are well known in the art. See, for example, U.S. Pat. No. 5,717,034, the entire contents of which are hereby incorporated by reference herein.

Oxetanes

Oxetanes (i.e., 1,3-propylene oxides) are heterocyclic organic compounds with the molecular formula $C_3H_6O$, having a four-membered ring with three carbon atoms and one oxygen atom. The term oxetane also refers generally to any organic compound containing an oxetane ring. See, for example, Burkhard et al., in Angew. Chem. Int. Ed. 2010, 49, 9052-9067, the entire contents of which are hereby incorporated by reference herein.

Polyester-Based Resins

Polyesters contemplated for use in the practice of the present invention refer to condensation polymers formed by the reaction of polyols (also known as polyhydric alcohols), with saturated or unsaturated dibasic acids. Typical polyols used are glycols such as ethylene glycol; acids commonly used are phthalic acid and maleic acid. Water, a by-product of esterification reactions, is continuously removed, driving the reaction to completion. The use of unsaturated polyesters and additives such as styrene lowers the viscosity of the resin. The initially liquid resin is converted to a solid by cross-linking chains. This is done by creating free radicals at unsaturated bonds, which propagate to other unsaturated bonds in adjacent molecules in a chain reaction, linking the adjacent chains in the process.

Polyurethane-Based Resins

Polyurethanes contemplated for use in the practice of the present invention refer to polymers composed of a chain of organic units joined by carbamate (urethane) links. Polyurethane polymers are formed by reacting an isocyanate with a polyol. Both the isocyanates and polyols used to make polyurethanes contain on average two or more functional groups per molecule.

Polyimide-Based Resins

Polyimides contemplated for use in the practice of the present invention refer to polymers composed of a chain of organic units joined by imide linkages (i.e., —C(O)—N(R)—C(O)—). Polyimide polymers can be formed by a variety of reactions, i.e., by reacting a dianhydride and a diamine, by the reaction between a dianhydride and a diisocyanate, and the like.

Melamine-Based Resins

Melamines contemplated for use in the practice of the present invention refer to hard, thermosetting plastic materials made from melamine (i.e., 1,3,5-triazine-2,4,6-triamine) and formaldehyde by polymerization. In its butylated form, it can be dissolved in n-butanol and/or xylene. It can be used to cross-link with other resins such as alkyd, epoxy, acrylic, and polyester resins.

Urea-Formaldehyde-Based Resins

Urea-formaldehydes contemplated for use in the practice of the present invention refers to a non-transparent thermosetting resin or plastic made from urea and formaldehyde heated in the presence of a mild base such as ammonia or pyridine.

Phenol-Formaldehyde-Based Resins

Phenol-formaldehydes contemplated for use in the practice of the present invention refer to synthetic polymers obtained by the reaction of phenol or substituted phenol with formaldehyde.

Underfill film layers contemplated for use herein typically have a thickness in the range of about 5 µm up to about 200 µm. In some embodiments, the film thickness falls in the range of about 5-150 µm. In some embodiments, the film thickness falls in the range of about 5-100 µm. In some embodiments, the film thickness falls in the range of about 5-75 µm. In some embodiments, the film thickness falls in the range of about 5-60 µm.

Exemplary coating release liners contemplated for use herein include materials which undergo substantially no chemical interaction with the underfill film layer, including such materials as paper or plastic-based film sheets which are used to prevent the underfill film surface from sticking. Exemplary materials are plastic based materials such as PET, polyolefin, silicone, and the like.

Barrier films contemplated for use herein are materials which are substantially impervious to chemical migration into or out of the surface thereof. Exemplary barrier films include polyethylene terephthalates, fluoropolyolefins, perfluoropolyolefins, silicone layer(s), and the like.

Fluoropolyolefins contemplated for use herein include ETFEs (copolymers of ethylene and tetrafluoroethylene), perfluoroalkoxies, PCTFEs (polychloro trifluoroethylene films), FEPs (fluorinated ethylene propylene copolymers), PVDF (polyvinylidene difluorides), and the like.

Barrier films employed in the practice of the present invention typically have a thickness in the range of about 1 nm up to about 200 µm. In some embodiments, barrier films employed herein have a thickness in the range of about 10 nm-200 µm. In some embodiments, barrier films employed herein have a thickness in the range of about 100 nm-200 µm. In some embodiments, barrier films employed herein have a thickness in the range of about 100 nm-100 µm. In some embodiments, barrier films employed herein have a thickness in the range of about 50 nm-100 µm. In some embodiments, barrier films employed herein have a thickness in the range of about 10-50 µm. In some embodiments, barrier films employed herein have a thickness in the range of about 5-50 µm.

In certain embodiments, invention assemblies further comprise a layer of pressure sensitive adhesive tape on the exposed side of the barrier film. See, for example, FIG. 2. Exemplary pressure sensitive adhesives comprise elastomers based on acrylic polymers, rubber, ethylene-vinyl acetate, nitriles, styrene block copolymers, and the like.

In some embodiments, invention assemblies comprise:
an underfill film layer comprising a resin, a hardener and a filler,
a polyethylene terephthalate (PET) coating release liner, and
a fluoropolyolefin barrier film,
wherein the underfill film undergoes substantially no interaction with the barrier film, and maintains its properties favorable for use in underfill applications.

In some embodiments, invention assemblies comprise:
an underfill film layer comprising a resin, a hardener and a filler,
a polyethylene terephthalate (PET) coating release liner,
a fluoropolyolefin barrier film, and
a pressure sensitive adhesive (PSA) tape on the exposed side of the barrier film, said adhesive comprising elastomers based on acrylic polymers, rubber, ethylene-vinyl acetate, nitriles, styrene block copolymers, and the like,
wherein the underfill film undergoes substantially no interaction with the PSA, and maintains its properties favorable for use in underfill applications.

In some embodiments, invention assemblies comprise:
an underfill film layer comprising a resin, a hardener and a filler,
a polyethylene terephthalate (PET) coating release liner,
a pressure sensitive adhesive (PSA) tape comprising a layer of PSA on a fluoro-polymer backing layer,
wherein the underfill film undergoes substantially no interaction with the backing tape, and maintains its properties favorable for use in underfill applications.

In accordance with another embodiment of the present invention, there are provided methods to extend the shelf life of an underfill film layer supported by a coating release liner, said method comprising applying a barrier film to the exposed side of said underfill film layer.

As described herein, underfill film layers contemplated for use herein comprise one or more thermoset resins.

As also described in detail herein, barrier films contemplated for use herein are substantially impervious to chemical migration into or out of the surface thereof.

In accordance with yet another embodiment of the present invention, there are provided methods to extend the worklife of an underfill film layer supported by a coating release liner, said method comprising applying a barrier film to the exposed side of said underfill film layer.

In accordance with yet another embodiment of the present invention, there are provided articles comprising an underfill film as described herein adhered to a suitable substrate therefor.

Suitable substrates contemplated for use herein include polyethylene terephthalates, polymethyl methacrylates, polyolefins (e.g., polyethylenes, polypropylenes, and the like), polycarbonates, epoxy resins, polyimides, polyamides, polyesters, glass, Si die with silicon nitride passivation, Si die with polyimide passivation, BT substrates, bare Si, SR4 substrates, SR5 substrates, and the like.

The adhesion of said underfill film to said substrate in invention articles is typically at least 5 kg/cm$^2$ as tested with SiN die/PI die/SiO$_2$ (size: 3.81×3.81×700 mm$^3$), wherein the die is attached on a BT substrate at 120° C./1 kg force/5 seconds, then cured by ramping the temperature from room temperature to 175° C. over 30 minutes, then held at 175° C. for 5 hrs.

A variety of articles can be prepared employing invention materials, including, for example, flip chip packages, stacked die, hybrid memory cubes, TSV devices, and the like.

Various aspects of the present invention are illustrated by the following non-limiting examples. The examples are for illustrative purposes and are not a limitation on any practice of the present invention. It will be understood that variations and modifications can be made without departing from the spirit and scope of the invention. One of ordinary skill in the art readily knows how to synthesize or commercially obtain the reagents and components described herein.

Example 1

A first assembly is prepared comprising an acrylate chemistry-based under-fill film (having a thickness of 20-40 µm), between a PET coating release liner and a pressure sensitive adhesive tape (see FIG. 1). The worklife properties of the resulting assembly are then evaluated.

Figure 2:
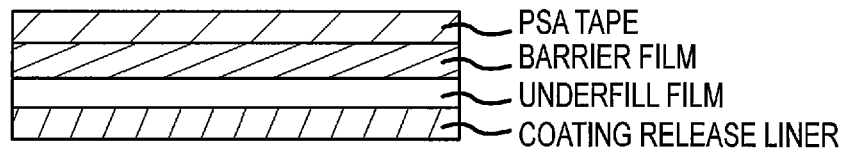
FIG. 2 illustrates an exemplary underfill film assembly according to the present invention comprising an underfill film layer between a coating release liner and a barrier film, wherein a pressure sensitive adhesive (PSA) tape is applied on the exposed side of the barrier film.

A second assembly is prepared comprising the same underfill film between a coating release liner and a barrier film, and further comprising a pressure sensitive adhesive tape applied to the exposed surface of the barrier film (see FIG. 2). The worklife properties of the resulting assembly are then evaluated.

Results with the first and second assemblies are presented in Table 1.

TABLE 1

| Worklife testing results | | | Format II | | | |
|---|---|---|---|---|---|---|
| Items | Data | unit | Initial | Day 1 | Day 2 | Day 7 |
| DSC | DSC onset | deg C. | 163.69 | 162.97 | 162.03 | 164 |
|  | DSC peak | deg C. | 170.82 | 170.88 | 170.31 | 170.77 |
|  | delta T (onset to peak) | deg C. | 7.13 | 7.91 | 8.28 | 6.77 |
|  | DSC Delta H | J/g | 69.17 | 63.09 | 66.15 | 65.44 |
| Worklife testing results | | | Format I | | | |
| Items | Data | unit | Initial | Day 1 | Day 2 | Day 7 |
| DSC | DSC onset | deg C. | 158.16 | 156.21 | 155.94 | 159.94 |
|  | DSC peak | deg C. | 166.83 | 168.78 | 171.41 | 179.7 |
|  | delta T (onset to peak) | deg C. | 8.67 | 12.57 | 15.47 | 19.76 |
|  | DSC Delta H | J/g | 75.71 | 70.93 | 61.29 | 34.19 |

The results set forth in Table 1 demonstrate that prior art assemblies such as Format I (see FIG. 1), lacking the presence of a barrier film, show significant material property change during worklife testing. For example, the DSC peak temperature up-shifted>10 deg C., deltaT increased>2× times, and reaction heat dropped to >50%.

In contrast (see Format II, FIG. 2), the underfill film of assemblies prepared using a barrier film show much improved stability.

Example 2

Figure 3:
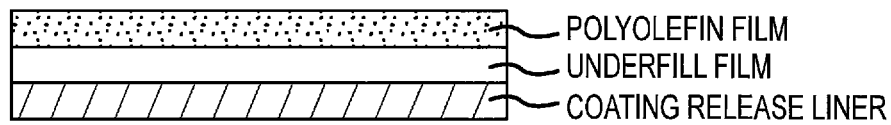
FIG. 3 illustrates another prior art format for underfill film assemblies, comprising an underfill film layer between a coating release liner and a polyolefin film.

Additional assemblies were prepared as follows. A third assembly is prepared comprising an underfill film between a coating release liner and a polyolefin film (see FIG. 3). The worklife properties of the resulting assembly are then evaluated.

Figure 4:
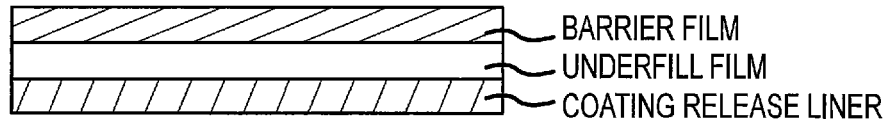
FIG. 4 illustrates yet another exemplary underfill film assembly according to the invention comprising an underfill film layer between a coating release liner and a barrier film.

A fourth assembly is prepared comprising an underfill film between a coating release liner and a barrier film (see FIG. 4). The worklife properties of the resulting assembly are then evaluated.

Results with the third and fourth assemblies are presented in Table 2.

TABLE 2

| Worklife testing results | | | Format IV | | | |
|---|---|---|---|---|---|---|
| Items | Data | unit | Initial | Day 1 | Day 2 | Day 7 |
| DSC | DSC onset | deg C. | 163.69 | 162.32 | 161.09 | 159.14 |
| | DSC peak | deg C. | 170.82 | 170.62 | 170.35 | 169.11 |
| | delta T (onset to peak) | deg C. | 7.13 | 8.3 | 9.26 | 9.97 |
| | DSC Delta H | J/g | 69.17 | 65.74 | 64.23 | 64.76 |
| Worklife testing results | | | Format III | | | |
| Items | Data | unit | Initial | Day 1 | Day 2 | Day 7 |
| DSC | DSC onset | deg C. | 162.02 | 163.37 | 163.37 | 163.14 |
| | DSC peak | deg C. | 170.35 | 176.63 | 176.63 | 177.87 |
| | delta T (onset to peak) | deg C. | 7.12 | 13.26 | 12.35 | 14.73 |
| | DSC Delta H | J/g | 68.59 | 47.91 | 46.47 | 45.5 |

The comparison between Format III (see FIG. 3—lacking a barrier film) and Format IV (FIG. 4), shows that the underfill material undergoes significant material property change during worklife testing, e.g., the DSC peak temperature up-shifted>7 deg C., deltaT increased>2× times, and reaction heat dropped to >30%.

In contrast, the underfill film in assemblies of Format IV (FIG. 4), which includes a barrier film, shows much more stability.

Example 3

Figure 5:
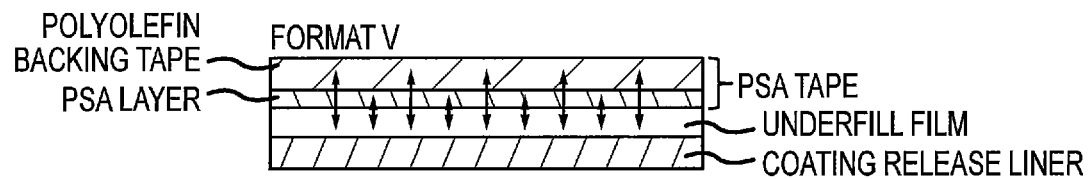
FIG. 5 illustrates another prior art format for underfill film assemblies, comprising an underfill film between a coating release liner and a pressure sensitive tape, wherein the PSA tape is composed of two layers: one layer is a PSA layer, the other layer is a polyolefin backing tape.

Additional assemblies are prepared as follows. A fifth assembly is prepared comprising an underfill film between a coating release liner and a pressure sensitive tape (see FIG. 5). This PSA tape is composed of two layers: one layer is PSA layer, the other layer is a polyolefin backing tape. The worklife properties of the resulting assembly are then evaluated.

Figure 6:
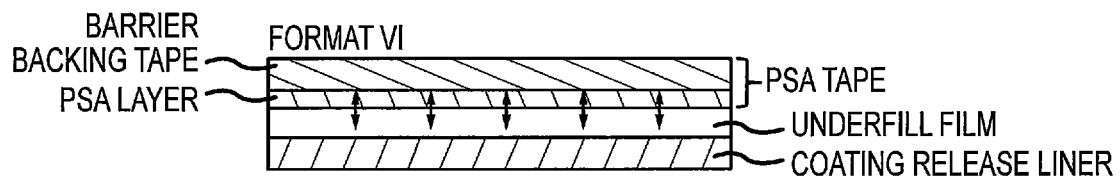
FIG. 6 illustrates yet another exemplary underfill film assembly according to the invention comprising an underfill film between a coating release liner and pressure sensitive tape, wherein the PSA tape is composed of two layers: one layer is PSA layer, the other layer fluoro-polymer.

A sixth assembly is prepared comprising an underfill film between a coating release liner and pressure sensitive tape (see FIG. 6). This PSA tape is composed of two layers: one layer is PSA layer, the other layer fluoro-polymer. The worklife properties of the resulting assembly are then evaluated.

Results with the fifth and sixth assemblies are presented in Table 3.

TABLE 3

| Accelerated Worklife testing results | | | Format VI | | | |
|---|---|---|---|---|---|---|
| Items | Data | unit | Initial | Day 1 | Day 2 | Day 7 |
| DSC | DSC onset | deg C. | 160.64 | 160.69 | 159.45 | 158.58 |
| | DSC peak | deg C. | 166.96 | 175.31 | 175.86 | 180.76 |
| | delta T (onset to peak) | deg C. | 6.32 | 14.62 | 16.41 | 22.18 |
| | DSC Delta H | J/g | 73.29 | 48.2 | 47.76 | 33.1 |
| Accelerated Worklife testing results | | | Format V | | | |
| Items | Data | unit | Initial | Day 1 | Day 2 | Day 7 |
| DSC | DSC onset | deg C. | 160.64 | 158.12 | 155.9 | 128.86 |
| | DSC peak | deg C. | 166.96 | 177.00 | 178.52 | 154.13, 181.62 |
| | delta T (onset to peak) | deg C. | 6.32 | 18.88 | 22.62 | two peaks |
| | DSC Delta H | J/g | 73.29 | 43.48 | 43.22 | 46.94 |

The comparison between Format V (see FIG. 5—lacking a barrier film) and Format VI (FIG. 6), shows that the underfill material undergoes significant material property change during worklife testing, e.g., the DSC onset temperature down-shifted to <130° C., and the DSC became multiple peaks.

In contrast, the underfill film in assemblies of Format VI (FIG. 6), which includes a barrier film, shows much more stability.

Various modifications of the present invention, in addition to those shown and described herein, will be apparent to those skilled in the art of the above description. Such modifications are also intended to fall within the scope of the appended claims.

Patents and publications mentioned in the specification are indicative of the levels of those skilled in the art to which the invention pertains. These patents and publications are incorporated herein by reference to the same extent as if each individual application or publication was specifically and individually incorporated herein by reference.

The foregoing description is illustrative of particular embodiments of the invention, but is not meant to be a limitation upon the practice thereof. The following claims, including all equivalents thereof, are intended to define the scope of the invention.

That which is claimed is:

1. An underfill film-containing assembly, said assembly comprising:
    an underfill film layer consists of a thermoset resin, a hardener, and a filler, the underfill film layer being disposed between
    a coating release liner which is a paper or plastic-based film sheet that undergoes substantially no chemical interaction with the underfill film layer, and
    a barrier film which is substantially impervious to chemical migration into or out of a surface thereof and comprises a fluoropolyolefin selected from an ETFE (copolymer of ethylene and tetrafluoroethylene), a perfluoroalkoxy, a PCTFE (polychloro trifluoroethylene) film, an FEP (fluorinated ethylene propylene copolymer), or a PVDF (polyvinylidene difluoride), wherein the assembly further includes:
    a layer of pressure sensitive adhesive tape on an exposed side of the barrier film opposite the underfill film layer.

2. The assembly of claim 1, wherein said thermoset resin is selected from an epoxy-based resin, a maleimide-based resin, a nadimide-based resin, an itaconamide-based resin, an acrylate-based resin, cyanate ester-based resins, silicones, oxetanes, polyester-based resins, polyurethane-based resins, polyimide-based resins, melamine-based resins, urea-formaldehyde-based resins, phenol-formaldehyde-based resins, as well as mixtures of any two or more thereof.

3. The assembly of claim 1 wherein the underfill film layer has a thickness in the range of about 5 µm up to about 200 µm.

4. The assembly of claim 1 wherein the coating release liner is plastic based film sheet.

5. The assembly of claim 4 wherein the plastic based film sheet is selected from polyethylene terephthalate (PET), a polyolefin, or a silicone.

6. The assembly of claim 1 wherein the barrier film has a thickness in the range of about 1 nm up to about 200 μm.

7. The assembly of claim 1 wherein a pressure sensitive adhesive of the pressure sensitive adhesive tape is an elastomeric acrylic-based resin.

8. The assembly of claim 1 wherein:
said plastic based film sheet comprises PET.

9. The assembly of claim 8 wherein:
a pressure sensitive adhesive of the pressure sensitive adhesive tape comprises elastomers based on acrylic polymers, rubber, ethylene-vinyl acetate, nitriles, or styrene block copolymers.

* * * * *